United States Patent
Mori et al.

(10) Patent No.: US 7,948,005 B2
(45) Date of Patent: May 24, 2011

(54) INSULATED-GATE BIPOLAR TRANSISTOR (IGBT)

(75) Inventors: Mutsuhiro Mori, Mito (JP); Taiga Arai, Mito (JP)

(73) Assignee: Hitachi, Ltd., Tokyo (JP)

( * ) Notice: Subject to any disclaimer, the term of this patent is extended or adjusted under 35 U.S.C. 154(b) by 330 days.

(21) Appl. No.: 12/121,045

(22) Filed: May 15, 2008

(65) Prior Publication Data

US 2008/0283867 A1 Nov. 20, 2008

(30) Foreign Application Priority Data

May 17, 2007 (JP) ................................. 2007-132051

(51) Int. Cl.
*H01L 29/74* (2006.01)
*H01L 31/111* (2006.01)
(52) U.S. Cl. ........................ 257/133; 257/132; 257/137
(58) Field of Classification Search .................. 257/132, 257/133, 137, E29.167, E29.197
See application file for complete search history.

(56) References Cited

U.S. PATENT DOCUMENTS

| 5,144,408 | A * | 9/1992 | Iwasaki ......................... 257/557 |
| 5,838,026 | A * | 11/1998 | Kitagawa et al. ............. 257/139 |
| 7,173,290 | B2 * | 2/2007 | Chang ........................... 257/107 |
| 7,423,316 | B2 * | 9/2008 | Kawaji et al. ................. 257/330 |
| 2008/0012040 | A1 * | 1/2008 | Saito et al. ..................... 257/133 |

FOREIGN PATENT DOCUMENTS

| DE | 102005004354 A1 | 8/2006 |
| EP | 0854518 A1 | 7/1998 |
| JP | 10-178174 | 6/1998 |
| JP | 2000-307116 | 11/2000 |
| JP | 2003-347549 | 12/2003 |
| JP | 2007-150121 | 6/2007 |

OTHER PUBLICATIONS

Office Action issued on Dec. 23, 2009 in German counterpart application. (English translation of Office Action).

* cited by examiner

*Primary Examiner* — Phuc T Dang
(74) *Attorney, Agent, or Firm* — Antonelli, Terry, Stout & Kraus, LLP.

(57) ABSTRACT

A fourth semiconductor region of a first conduction type is provided in a partial region of a third semiconductor region of a second conduction type. This configuration enhances the blocking voltage at the time when the sheet carrier concentration of a fifth semiconductor region is enhanced.

6 Claims, 11 Drawing Sheets

US 7,948,005 B2

INSULATED-GATE BIPOLAR TRANSISTOR (IGBT)

BACKGROUND OF THE INVENTION

The present invention relates to semiconductor devices such as an insulated-gate bipolar transistor (IGBT), and more particularly to its low-loss implementation.

The insulated-gate bipolar transistor (IGBT) is a switching element in which a current flown between a collector electrode and an emitter electrode is controlled using a voltage applied to a gate electrode. This IGBT is provided with features that it is capable of dealing with a comparatively wide range of power, and that its switching frequency is broad enough. Accordingly, in recent years, the IGBT has been in wide use, which ranges from home-use small-power appliances, such as air conditioners and microwave ovens, to large-power appliances such as inverters in railroads and steelmaking plants.

Among these IGBT's performances, one of performances whose improvement is requested most seriously is a reduction in its loss. In recent years, implementation of low-loss IGBTs have been considered and designed.

For example, FIG. 11 illustrates a planar-type highly-conductive IGBT disclosed in JP-A-10-178174. In this IGBT, a p layer 100 is in contact with a collector electrode C. Moreover, an n layer 111, whose carrier concentration is lower than that of this p layer 100, is multi-layered on the p layer 100. An n⁻ layer 110, which has a substantially uniform carrier concentration lower than that of the n layer 111, is multi-layered on the n layer 111. An n layer 150 is diffused on the other surface side of this n⁻ layer 110. A p layer 120 is formed within the n layer 150, and further, an n⁺ layer 130 is formed within this p layer 120. On the surfaces of the n⁺ layer 130, the p layer 120, the n layer 150, and the n⁻ layer 110, a MOS gate is provided which is formed by including an insulating film 300, an insulating film 400, and a gate electrode G insulated with these insulating films 300 and 400.

Meanwhile, a p⁺ layer 121 is formed on the surface of the p layer 120. The p⁺ layer 121 and the n⁺ layer 130 are in low-resistance contact with an emitter electrode E. The respective electrodes E, C, and G are electrically guided to terminals which correspond thereto respectively.

In this IGBT, its main feature is that the n layer 150 is formed on the periphery and circumference of the p layer 120. By providing with this n layer 150, it is made more difficult and less likely that holes flow into the p layer 120 by the MOS gate, the holes being injected from the p layer 100 by electrons which have flown into the n⁻ layer 110, and it makes the carrier concentration inside the n⁻ layer 110 higher. As a result, the n⁻ layer 110 becomes highly conductive, which enables implementation of a low-loss IGBT. Here, the formation of the n layer 150 increases the gate's feedback capacity which becomes a cause for malfunction due to noise. Accordingly, the feedback capacity is reduced by thickening the gate insulating film 300 partially.

Moreover, FIG. 12 illustrates a trench-type highly-conductive IGBT disclosed in JP-A-2000-307116. In this IGBT, a plurality of trench-gate structures T, which include a gate electrode G insulated with a gate insulating film 300, are formed on the side of an emitter electrode E alternately with two different spacings placed therebetween. Among the spacings between the trench gates, in the narrow-width portion, an n layer 151 which is in contact with an n⁻ layer 110 is formed. A p layer 120 is formed such that it is made adjacent to this n layer 151. Also, a p⁺ layer 121 and an n⁺ layer 130, which are in low-resistance contact with the emitter electrode 600, are formed inside the p layer 120.

Meanwhile, among the spacings between the trench gates, in the broad-width portion, a p layer 125 is formed. The p layer 125 is insulated from the emitter electrode E with insulating films 401 and 402. The n layer 151 becomes a barrier against holes which are injected from the p layer 100. Accordingly, the n layer 151 exhibits an effect of accumulating electric charges within the n⁻ layer 110, thereby enhancing the conductivity. Also, the p layer 125 has a function of collecting the holes injected from the p layer 100 into the p layer 125. These holes flow in proximity to the trench gate, then flowing into the emitter electrode E via the n layer 151, the p layer 120, and the p⁺ layer 121. A potential difference when the holes flow in proximity to the trench gate induces electron injection from an inversion layer of the trench gate, and further, promotes conductivity modulation of the n⁻ layer 110. As a result of this, the IGBT becomes a low-loss IGBT.

SUMMARY OF THE INVENTION

In the above-described conventional IGBTs, the carrier concentration of the n layer 150 or 151, which intervenes between the p layer 120 existing on the emitter side and the n⁻ layer 110 accumulating the electric charges, is made higher. This enhancement operation reduces the ON voltage, thereby enabling the conventional IGBTs to operate at low-loss. There has been a problem, however, that making the carrier concentration of this n layer 150 or 151 higher and higher results in a lowering in the blocking voltage. As a specific experimental example, as illustrated in FIG. 13, raising the sheet carrier concentration (i.e., plane density of the carrier concentration on a plane whose depth is constant from the emitter-side surface) of the n layer 150 or 151 reduces the ON voltage. The breakdown voltage, however, lowers steeply beyond the sheet barrier concentration of $1 \times 10^{12}/cm^2$ (this value can be regarded as the threshold value in this case), resulting in a lowering in the blocking-voltage.

Consequently, the ON voltage capable of maintaining the breakdown voltage which is large enough from the practical viewpoint is restricted by this limit (i.e., the value lower than $1 \times 10^{12}/cm^2$) of the sheet carrier concentration of the n layer 150 or 151.

In view of the above-described actual circumstances, the present invention has been devised. Accordingly, one of the objects thereof is to provide a semiconductor device which makes it possible to accomplish the low-loss operation without damaging the blocking voltage.

In the present invention for solving the problem in the above-described conventional embodiments, there is provided a semiconductor device in which a collector electrode is provided such that the collector electrode is in contact with one surface side of a semiconductor substrate, the semiconductor device including: a first layer portion in which a first semiconductor region of a first conduction type, a second semiconductor region of a second conduction type, and a third semiconductor region of the second conduction type having carrier concentration lower than carrier concentration of the second semiconductor region are multilayered from the one surface side; a second layer portion having a fourth semiconductor region of the first conduction type multilayered in a partial region of the third semiconductor region, and having carrier concentration higher than carrier concentration of the third semiconductor region, a fifth semiconductor region of the second conduction type multilayered on the fourth semiconductor region, a sixth semiconductor region of the first conduction type multilayered on the fifth semiconductor region, and a seventh semiconductor region of the second conduction type multilayered in a partial region of the sixth semiconductor region, and having carrier concentration higher than carrier concentration of the sixth semiconductor region; a gate electrode located along the second layer portion via a gate insulating film, the gate insulating film being provided such that the gate insulating film is in contact with the semiconductor regions included in the second layer portion; and an emitter electrode which is in low-resistance contact with the seventh semiconductor region of the second layer portion.

Also, the plane density (i.e., sheet carrier concentration) of carrier concentration on a plane whose distance from a surface on the emitter-electrode side is constant is set to be higher than $1\times10^{12}/cm^2$ within the fourth semiconductor region.

Moreover, the surfaces of the sixth and seventh semiconductor regions with which the emitter electrode is in contact, and the surfaces onto which the third, fourth, fifth, sixth and seventh semiconductor regions are exposed and on which the gate oxide film is formed may exist on substantially the same flat plane. Furthermore, the gate oxide film may be formed, along the respective semiconductor regions included in the second layer portion, and on a side surface of a trench, the trench extending toward the first layer portion and attaining to the third semiconductor region.

When the trench is provided in this way, the trench, on its one side surface, may be in contact with the respective semiconductor regions included in the second layer portion, an eighth semiconductor region of the first conduction type being in contact with the other side surface of the trench, the eighth semiconductor region being multilayered within the third semiconductor region such that a partial region of the eighth semiconductor region may be in contact therewith, and having carrier concentration higher than the carrier concentration of the third semiconductor region. Moreover, the trenches may be provided in plural number. When the trenches are provided in plural number in this way, the trenches may be arranged such that spacing between the trenches which are adjacent to each other via the eighth semiconductor region is wider than spacing between the trenches which are adjacent to each other with the second layer portion sandwiched therebetween. Furthermore, a ninth semiconductor region of the second conduction type may be formed within the sixth semiconductor region, the ninth semiconductor region intervening between the seventh semiconductor region and the gate oxide film formed on the side surface of the trench.

Incidentally, the density of carrier concentration on a plane whose distance from a surface on the emitter-electrode side is constant may be lower than $1\times10^{17}/cm^3$ within the fifth semiconductor region.

Also, a semiconductor device according to one aspect of the present invention includes a semiconductor substrate portion of a second conduction type; a first semiconductor layer multilayered on one surface side of the semiconductor substrate portion, and formed using a semiconductor of the second conduction type having a carrier concentration higher than the carrier concentration of the semiconductor of the semiconductor substrate portion; a second semiconductor layer multilayered further on the first semiconductor layer, formed using a semiconductor of a first conduction type, and being in contact with a collector electrode; a semiconductor layer portion multilayered on the other surface side of the semiconductor substrate portion, the semiconductor layer portion and a gate electrode being adjacent to each other via an insulating film; the semiconductor layer portion having a third semiconductor layer being in contact with an emitter electrode, and formed using a semiconductor of the first conduction type, a fourth semiconductor layer multilayered on a side of the third semiconductor layer opposite to the emitter electrode, and formed using a semiconductor of the second conduction type having carrier concentration lower than carrier concentration of the semiconductor of which the third semiconductor layer is formed, and a fifth semiconductor layer multilayered further on the fourth semiconductor layer, and formed using a semiconductor of the first conduction type; and an intervention layer portion intervening between the semiconductor substrate portion and the semiconductor layer portion such that the intervention layer portion is sandwiched therebetween, and formed using a semiconductor of the first conduction type. In this case, the surface density of carrier concentration on a surface whose distance from a surface on the emitter-electrode side is constant may be equal to or higher than $1\times10^{12}/cm^2$ in the intervention layer portion.

Also, this semiconductor device may be of either the planar-type structure or the trench-type structure.

According to the present invention, it becomes possible to accomplish the low-loss operation without damaging the blocking voltage.

Other objects, features and advantages of the invention will become apparent from the following description of the embodiments of the invention taken in conjunction with the accompanying drawings.

DETAILED DESCRIPTION OF THE INVENTION

Figure 1:
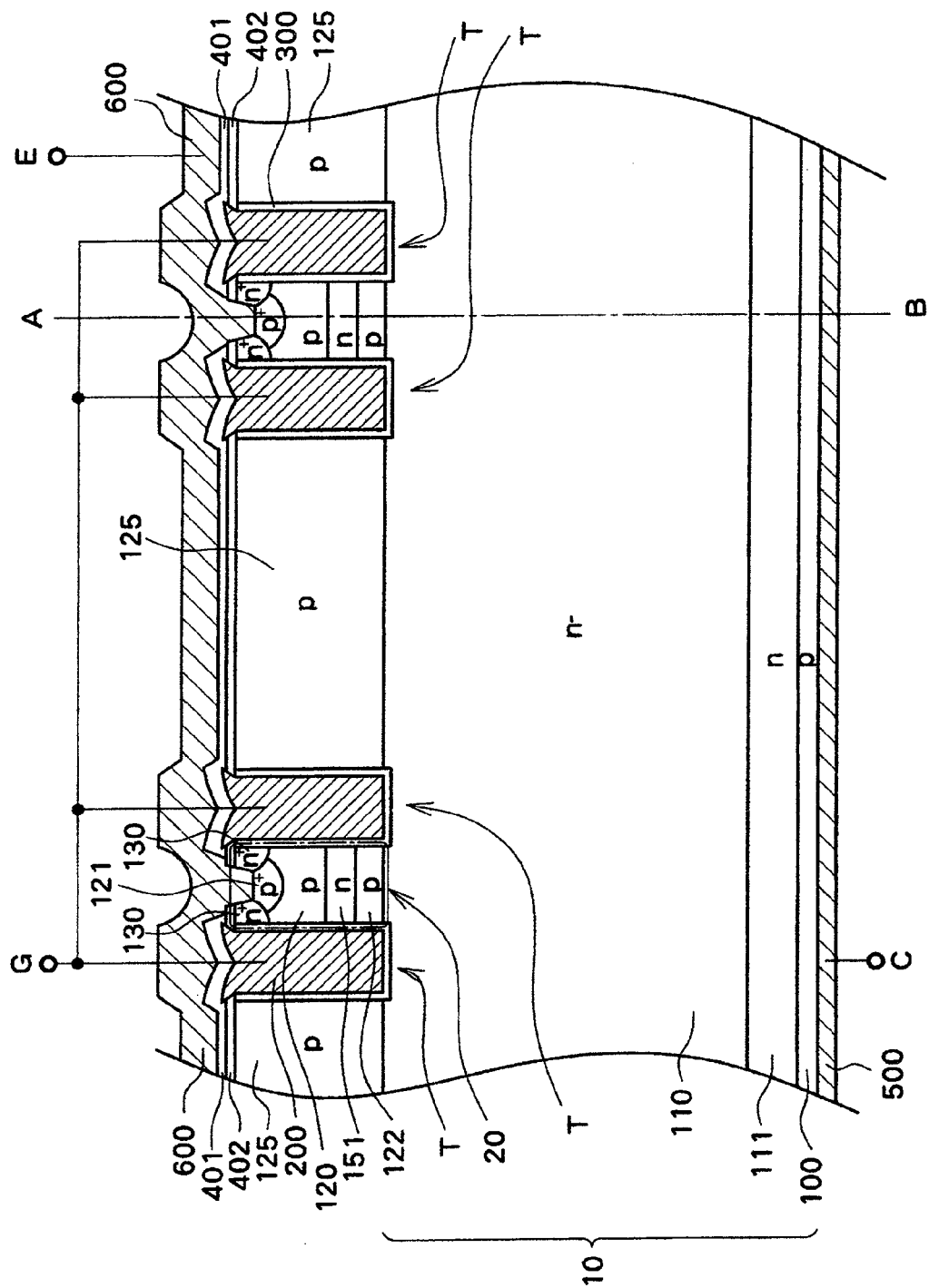
FIG. 1 is an explanatory diagram for illustrating a structure example of the semiconductor device according to an embodiment of the present invention.

Hereinafter, referring to the drawings, the explanation will be given below concerning embodiments of the present invention. The semiconductor device according to an embodiment of the present invention is an IGBT device, which is provided with a structure exemplified in FIG. 1. Namely, in this semiconductor device, from the side of a collector electrode C, a first layer portion 10 is formed by multilayering, from the side of a conductor plate 500 electrically connected to the collector electrode C, a first semiconductor region 100 formed with a semiconductor of a first conduction type (p type in FIG. 1), a second semiconductor region 111 formed with a semiconductor of a second conduction type (n type in FIG. 1), and a third semiconductor region 110 of the second conduction type formed with a semiconductor having carrier concentration lower than carrier concentration of the semiconductor with which the second semiconductor region 111 is formed.

Also, a gate insulating film (gate oxide film) 300 attains to the third semiconductor region 110, thereby forming at least one trench T. FIG. 1 illustrates a portion where the four trenches T are formed. The trenches T are arranged with the spacings therebetween made different alternately. Among these spacings, in a region where a comparatively broad spacing is opened, a region (eighth semiconductor region) 125 of the first conduction type is sandwiched. Also, in a region where a comparatively narrow spacing is opened, a second layer portion 20 where a plurality of semiconductor regions are multilayered is sandwiched.

This second layer portion 20 includes a fourth semiconductor region 122 of the first conduction type which is in contact with a partial region of the third semiconductor region 110, a fifth semiconductor region 151 as a hole barrier layer which is multilayered on this fourth semiconductor region 122, and formed with a semiconductor of the second conduction type, and a sixth semiconductor region 120 multilayered on this fifth semiconductor region 151, and formed with a semiconductor of the first conduction type. Also, a semiconductor region 121, which is formed with a semiconductor of the first conduction type and which has carrier concentration higher than carrier concentration of the sixth semiconductor region 120, is formed in a partial region of the sixth semiconductor region 120. This semiconductor region 121 is in no direct contact with the insulating films 300 and 402. Instead, a seventh semiconductor region 130 formed with a semiconductor of the second conduction type is made to intervene therebetween. The carrier concentration of this seventh semiconductor region 130 is made higher than the carrier concentrations of the second and fifth semiconductor regions 111 and 151.

Incidentally, the carrier concentration of the semiconductor with which the fourth semiconductor region 122 is formed is made higher than the carrier concentration of the semiconductor with which the third semiconductor region 110 is formed. Moreover, in the embodiment in FIG. 1, the surface on which the fourth semiconductor region 122 is in contact with the third semiconductor region 110 is of substantially the same depth as the surface on which the eighth semiconductor region 125 is in contact with the third semiconductor region 110.

The gate insulating film 402 is provided such that the film 402 is in contact with the respective semiconductor regions 122, 151, and 120 included in the second layer portion 20. Furthermore, a conductor 200 electrically connected to a gate electrode G is located such that the conductor 200 is made adjacent to the second layer portion 20 via the gate insulating film 402. Also, an emitter electrode E is in low-resistance contact (i.e., is electrically coupled) with the semiconductor region 121 of the second layer portion 20.

Also, here, the semiconductor with which the eighth semiconductor region 125 of the first conduction type is formed is multilayered within the third semiconductor region 110 such that a partial region of the eighth semiconductor region is in contact therewith. Moreover, the semiconductor has carrier concentration higher than the carrier concentration of the semiconductor with which the third semiconductor region 110 is formed.

In addition, in this embodiment, a semiconductor region of the second conduction type is made to intervene between the semiconductor region 121 and the insulating films 300 and 402.

Figure 2:
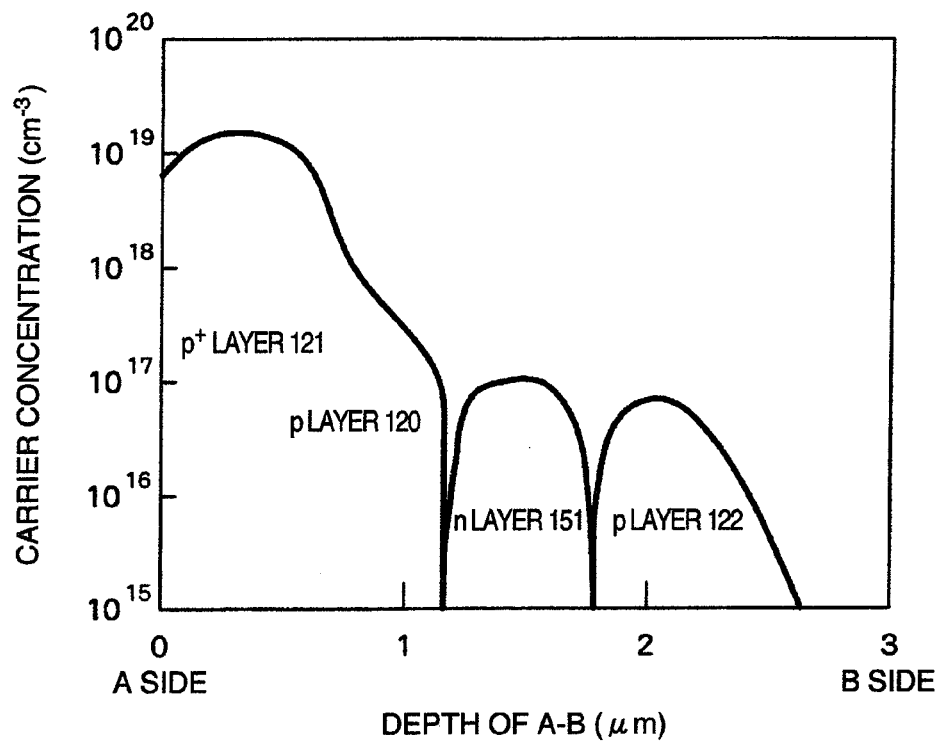
FIG. 2 is an explanatory diagram for illustrating an example of the carrier concentration of the semiconductor device according to the embodiment of the present invention.

When the semiconductor device illustrated in FIG. 1 is cut away along a cross section A-B which passes through the central portion (portion including the semiconductor region 121) of the second layer portion 20, a change in the carrier concentration along the cross section A-B is illustrated in FIG. 2.

Figure 3:
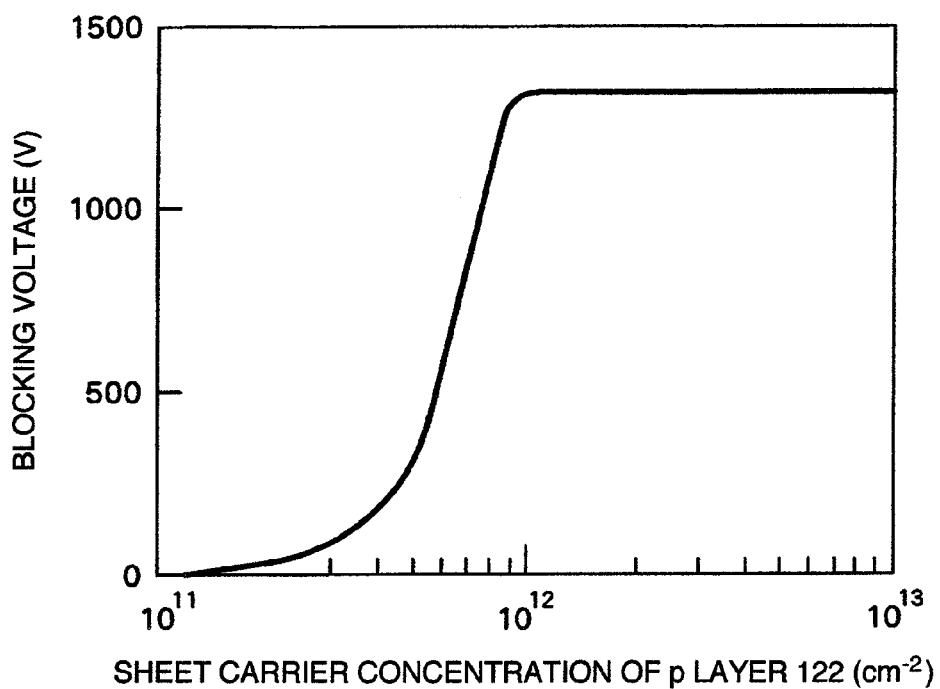
FIG. 3 is an explanatory diagram for illustrating an experimental result of the blocking voltage in the case that the sheet carrier concentration of a fourth semiconductor region is modified in the semiconductor device according to the embodiment of the present invention.

In this FIG. 2, the horizontal axis denotes depth heading from A to B, and the vertical axis denotes the sheet carrier concentration. The sheet carrier concentration is calculated by integrating (totaling) the carrier concentration along a plane perpendicular to the A-B cross section (i.e., plane whose distance (depth) from the emitter-electrode side is constant), and by dividing the integrated carrier concentration by the plane's area. FIG. 3 illustrates an experimental result of measurement of the blocking voltage when the sheet carrier concentration in the fourth semiconductor region 122 is changed when the sheet carrier concentration in the fifth semiconductor region 151 is made equal to or higher than $1\times10^{12}/cm^2$. As illustrated in FIG. 3, if the sheet carrier concentration of the semiconductor with which the fourth semiconductor region 122 is formed is made higher than $1\times10^{12}/cm^2$, the blocking-voltage property is maintained even if the sheet carrier concentration of the semiconductor with which the fifth semiconductor region 151 is formed is set higher than $1\times10^{12}/cm^2$.

Namely, the reason for this successful maintaining of the blocking-voltage property is as follows: Assuming that, e.g., the fifth semiconductor region 151 is the n layer and the fourth semiconductor region 122 is the p layer, in the case where the fourth semiconductor region 122 is absent, as disclosed in JP-A-2003-347549, electric-field intensity in the p-n junction between the sixth semiconductor region 120 and the fifth semiconductor region 151 is significantly high. As a result, the breakdown occurs between the region 120 and the region 151 of this p-n junction. In contrast to this situation, the presence of the fourth semiconductor region 122 makes it possible to suppress the significant enhancement in the electric-field intensity.

In this way, in present embodiment, the fourth semiconductor region 122 (intervention layer) is caused to intervene between the fifth semiconductor region 151 and the third semiconductor region 110. Moreover, the sheet carrier concentration of this intervention layer is made higher than $1\times10^{12}/cm^2$. This configuration and setting allows the sheet carrier concentration of the fifth semiconductor region 151 to be made higher than $1\times10^{12}/cm^2$ without lowering the breakdown voltage, thereby making it possible to reduce the ON voltage.

Incidentally, the fourth semiconductor region 122 and the fifth semiconductor region 151 can be formed using an ion implantation method with applied acceleration voltage at a few MeV or more. This allows implementation of a desire shape and a carrier concentration, thus making it possible to achieve a high blocking voltage and a low ON voltage.

Figure 4:
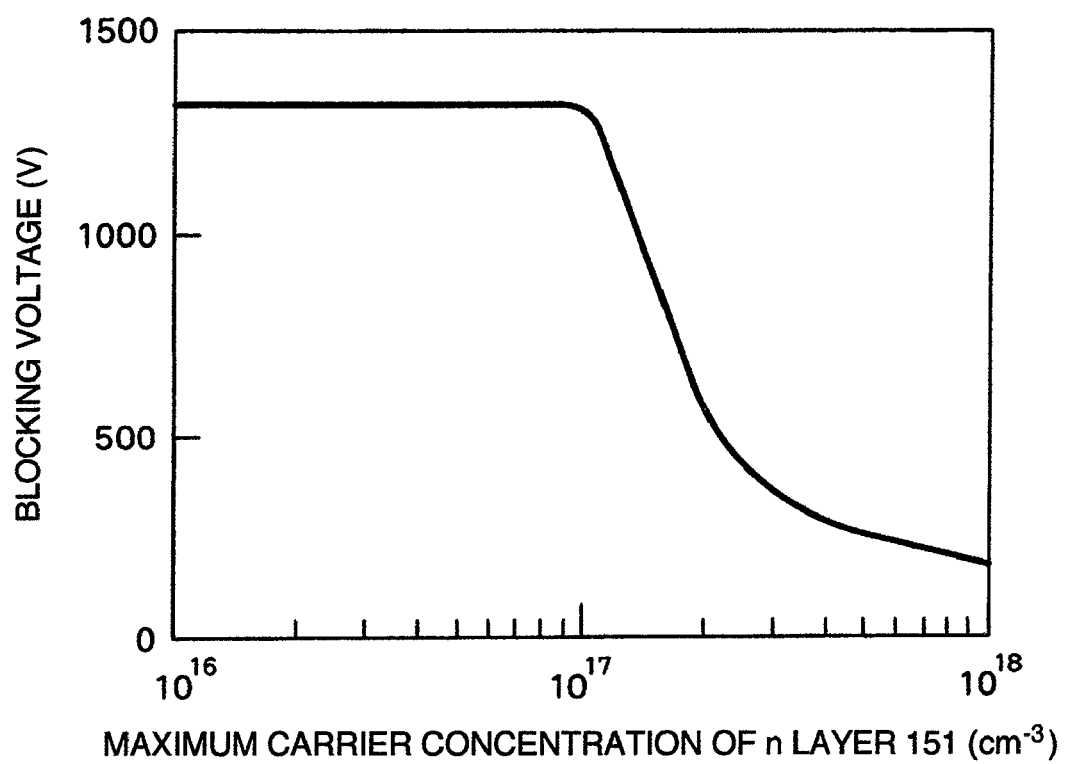
FIG. 4 is an explanatory diagram for illustrating an experimental result of the blocking voltage in the case that the sheet carrier concentration of a fifth semiconductor region is modified in the semiconductor device according to the embodiment of the present invention.

Moreover, FIG. 4 illustrates an experimental result which was obtained by changing the sheet carrier concentration of the fifth semiconductor region 151 thereby analyzing the relationship with the blocking voltage. According to this result, when the sheet carrier concentration of the fifth semiconductor region 151 becomes higher than $1\times10^{17}/cm^3$, the blocking voltage lowers steeply. Consequently, making the sheet carrier concentration of the fifth semiconductor region 151 lower than $1\times10^{17}/cm^3$ allows the blocking voltage to be ensured more stably.

Figure 5:
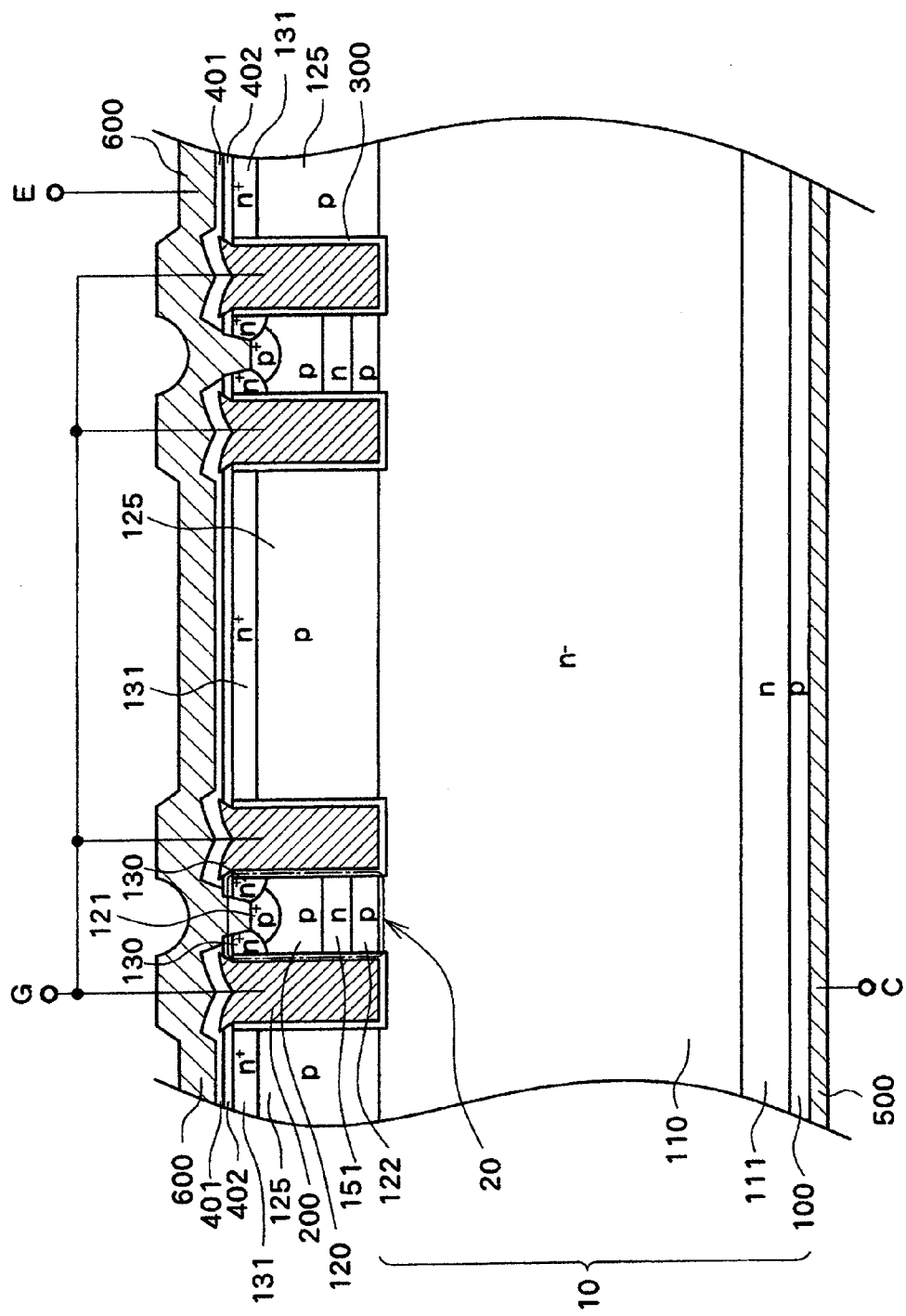
FIG. 5 is an explanatory diagram for illustrating another structure example of the semiconductor device according to the embodiment of the present invention.

Furthermore, FIG. 5 illustrates another embodiment of the present invention. In this embodiment, a ninth semiconductor region 131 is formed between the eighth semiconductor region 125 and the gate insulating film 402, using a semiconductor of the second conduction type different from the conduction type of the semiconductor of the eighth semiconductor region 125. The carrier concentration of this ninth semiconductor region 131 is made higher than the carrier concentration of the second semiconductor region 111 (e.g., the region 131 is formed as the n layer).

In this embodiment in FIG. 5, when the gate electrode G is switched ON, the $n^+$ layer, which is the seventh semiconductor region 130 surrounding the semiconductor region 121, and the $n^+$ layer, which is the ninth semiconductor region 131, become conductive via the inversion layer and accumulation layer on the periphery of the gate electrode G. In addition, a hole current, which flows through the p layer being the eighth semiconductor region 125, toward the emitter electrode 600, generates a potential difference within the eighth semiconductor region 125. As a result, electrons are injected from the ninth semiconductor region 131 into the eighth semiconductor region 125 and the third semiconductor region 110 (the $n^-$ layer in this embodiment).

This promotes the conductivity modulation in the third semiconductor region 110 as well which is in proximity to the eighth semiconductor region 125. Moreover, the ON voltage is reduced, which allows accomplishment of the low-loss operation. The situation remains basically the same if the conduction types are exchanged.

Figure 6:
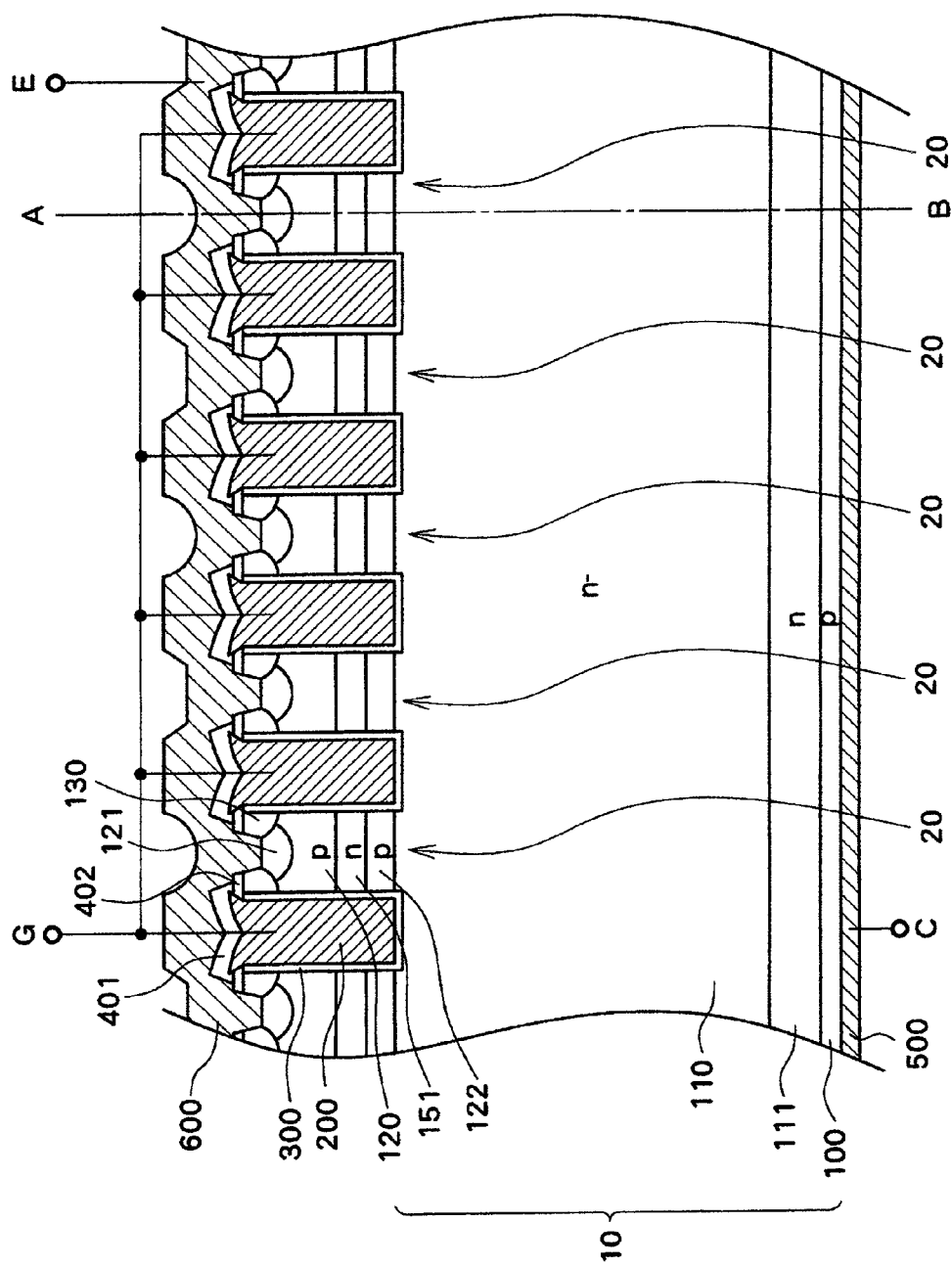
FIG. 6 is an explanatory diagram for illustrating still another structure example of the semiconductor device according to the embodiment of the present invention.

Incidentally, in the foregoing explanation, the trench gates are arranged with the broad spacing and the narrow spacing placed therebetween alternately. The eighth semiconductor region 125 (and the ninth semiconductor region 131), however, need not necessarily be provided. In this case, as is exemplified in FIG. 6, the configuration is such that the trench gates and the second layer portions 20 are arranged alternately.

This configuration makes it possible to enhance cell density per unit area, and to broaden channel width of the insulated gate. As a result, it becomes possible to reduce the ON voltage as well as to enhance its saturation current density. This mode is effective in the low-loss operation in such cases as sustain element where, like, e.g., plasma display, the load equivalent circuit is regarded as a capacitor, so that a significant instantaneous current flows.

Figure 7:
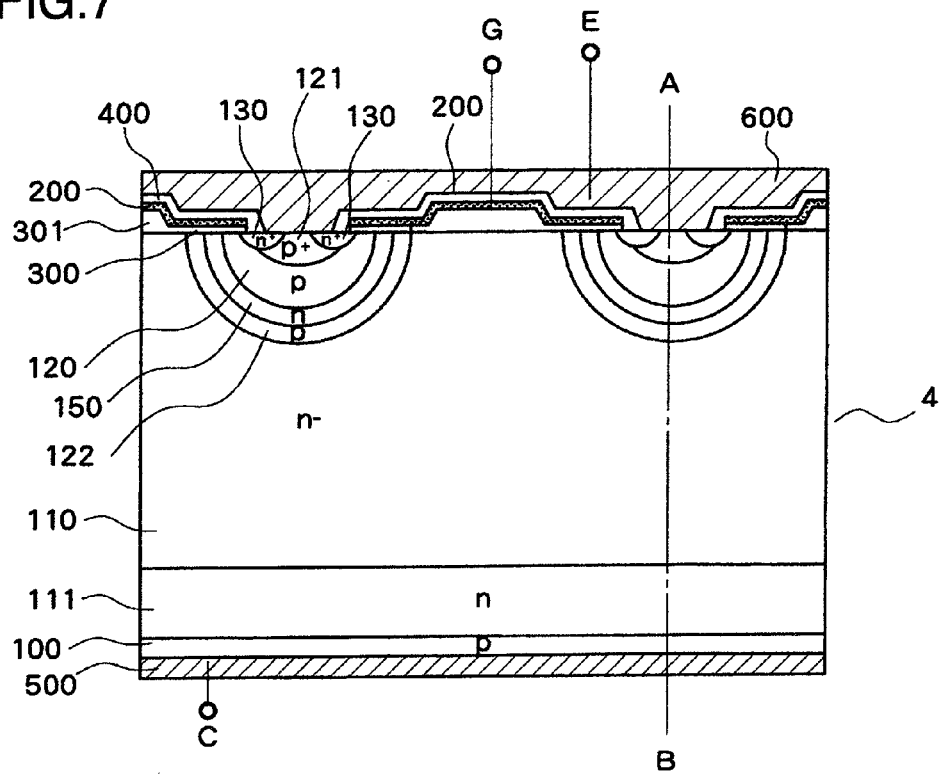
FIG. 7 is an explanatory diagram for illustrating a planar-type structure example of the semiconductor device according to the embodiment of the present invention.
Figure 8:
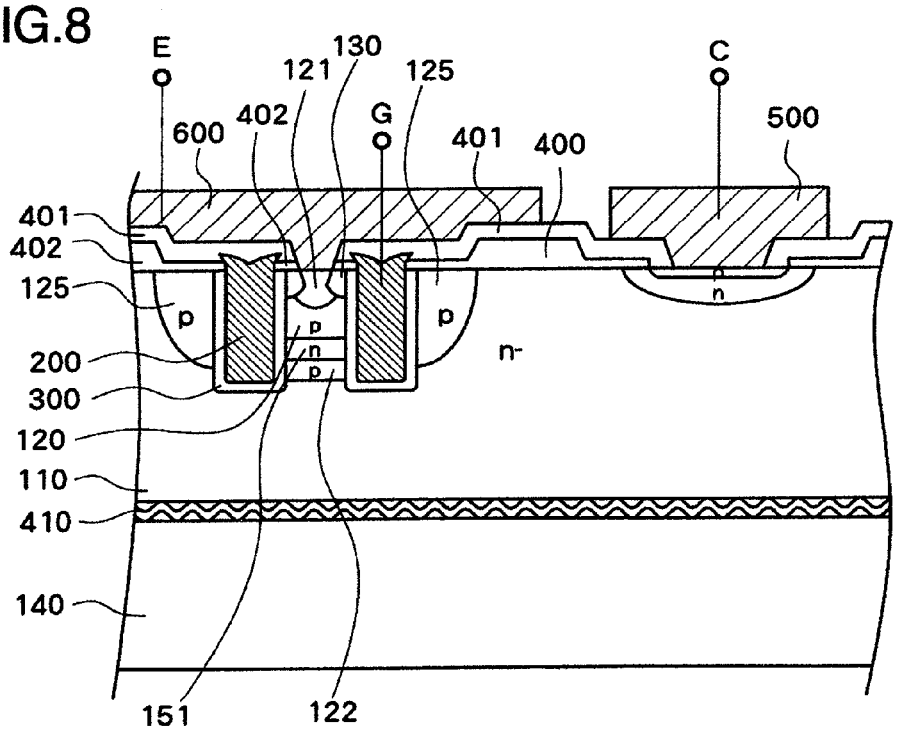
FIG. 8 is an explanatory diagram for illustrating a lateral-type structure example of the semiconductor device according to the embodiment of the present invention.
Figure 9:
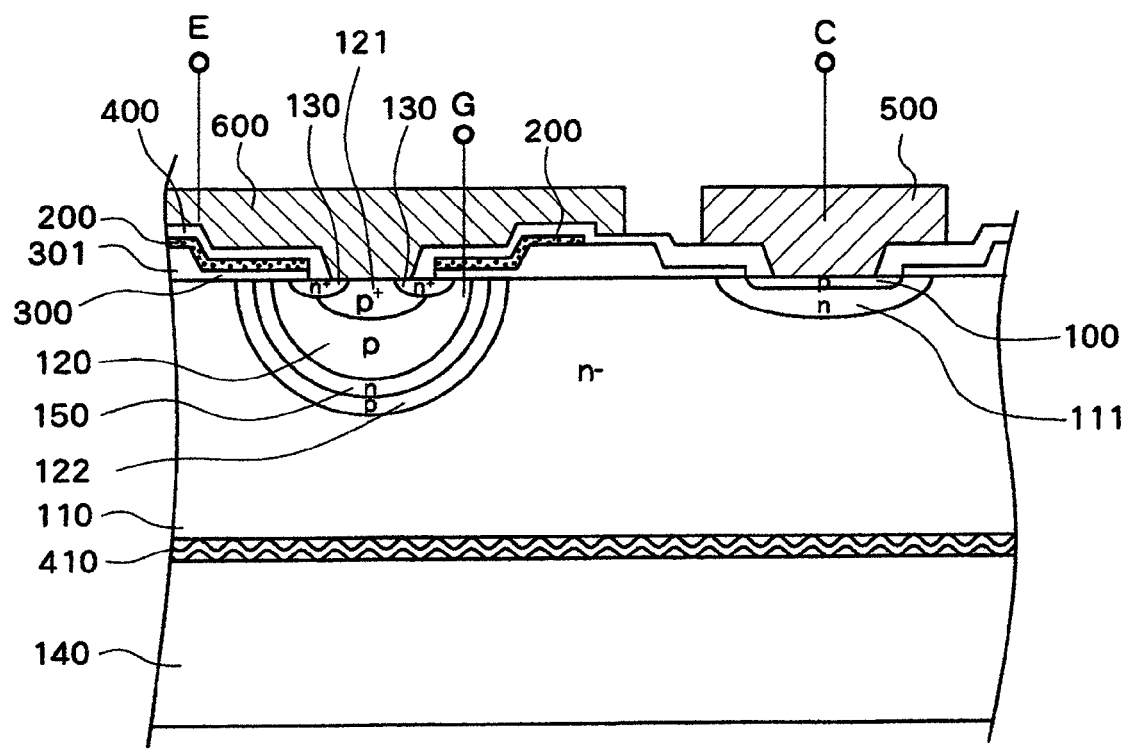
FIG. 9 is an explanatory diagram for illustrating an example where the semiconductor device according to the embodiment of the present invention has lateral-type planar structure.

Also, in the embodiments so far, the explanation has been given selecting the case of the trench-gate structure as its example. As is exemplified in FIG. 7, however, the planar-gate structure may also be employed as the semiconductor device of the present embodiment. Moreover, when applying the semiconductor device of the present embodiment to such integrated circuits as power IC, the lateral-type structure may also be employed as is exemplified in FIG. 8. In the structure exemplified in FIG. 8, the $n^-$ layer 110, i.e., the third semiconductor region, is provided on a support base 140 via the insulating film 410. The electrode 500 electrically connected to the collector electrode C is formed on substantially the same plane as the electrode 600 electrically connected to the emitter electrode E. This configuration makes it possible to facilitate such operations as line connection with another semiconductor device on this same plane. Furthermore, in this lateral-type structure as well, the planar-gate structure may also be employed as is exemplified in FIG. 9.

In all these embodiments, the sheet carrier concentration of the fourth semiconductor region 122 is made equal to or higher than $1\times10^{12}/cm^2$, and the sheet carrier concentration of the fifth semiconductor region 151 may be made equal to or lower than $1\times10^{17}/cm^3$.

Figure 10:
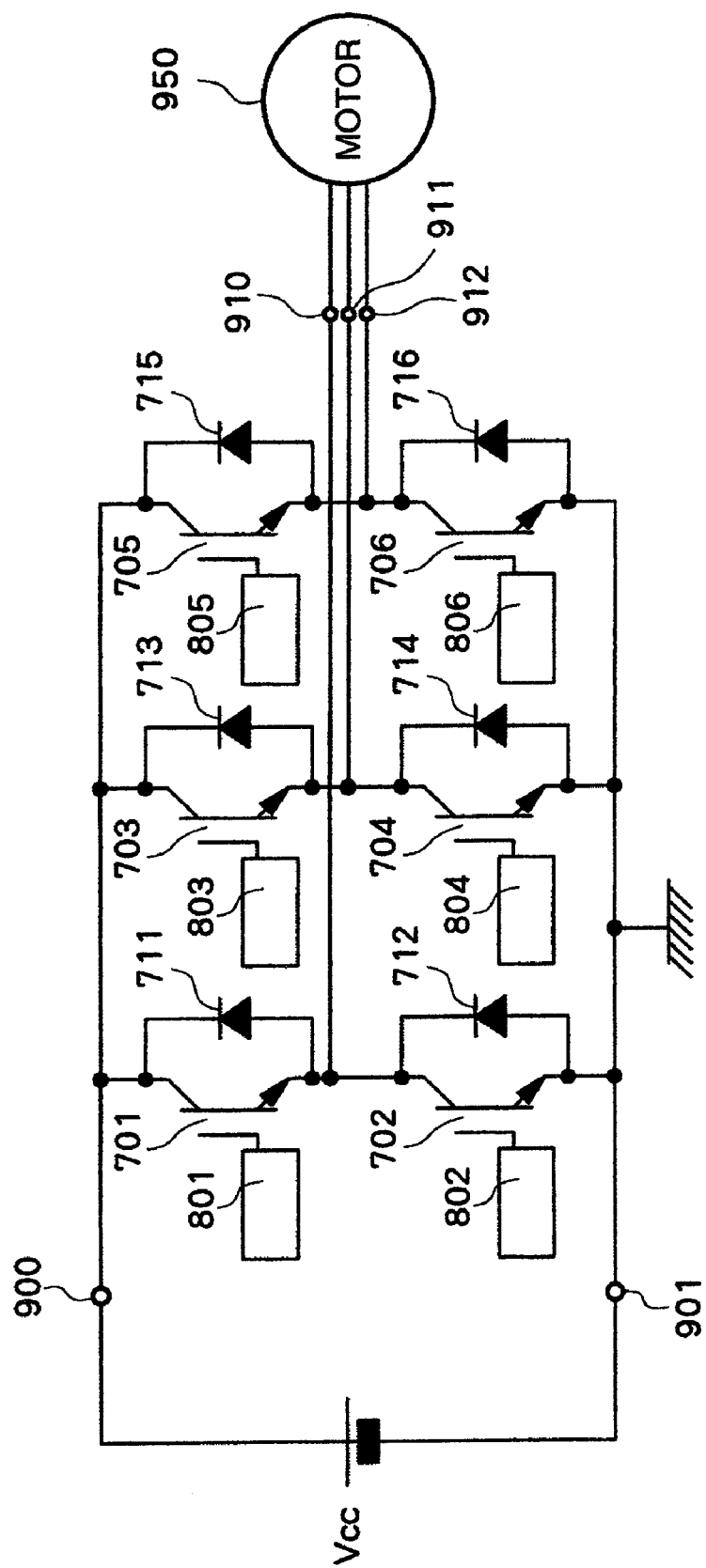
FIG. 10 is an explanatory diagram for illustrating an example of a power converter which uses the semiconductor device according to the embodiment of the present invention.
Figure 11:
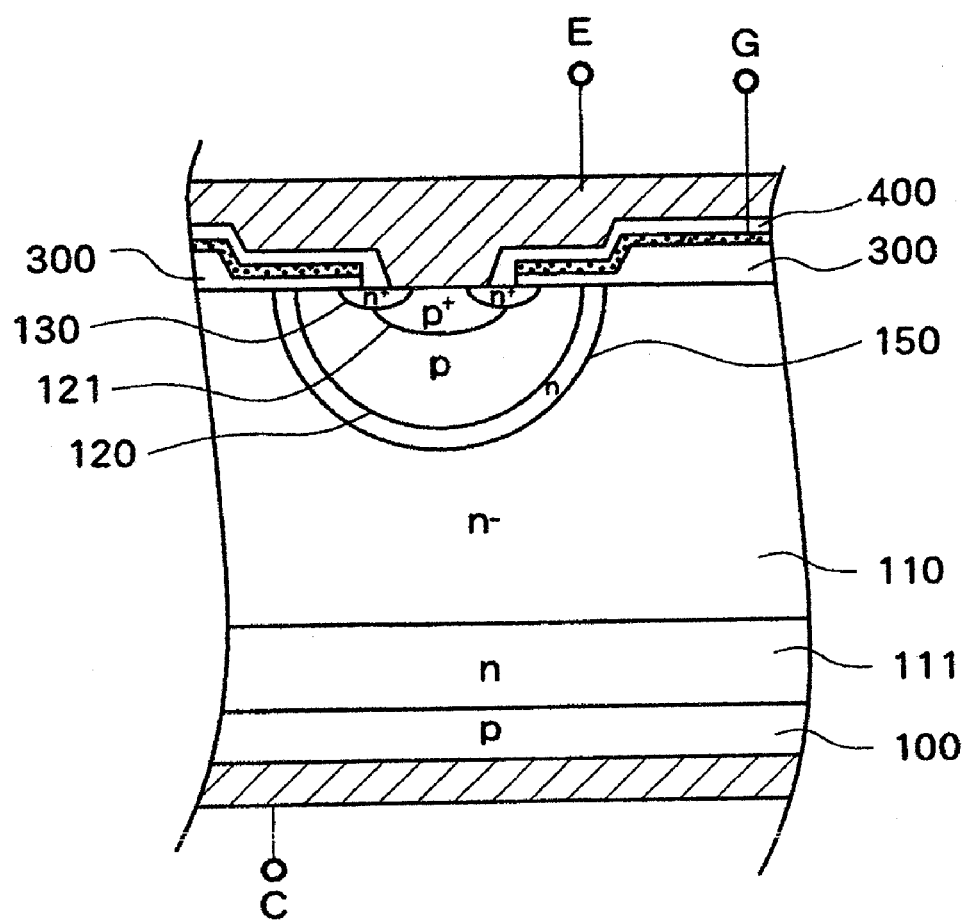
FIG. 11 is the explanatory diagram for illustrating the structure example of the planar structure semiconductor device.
Figure 12:
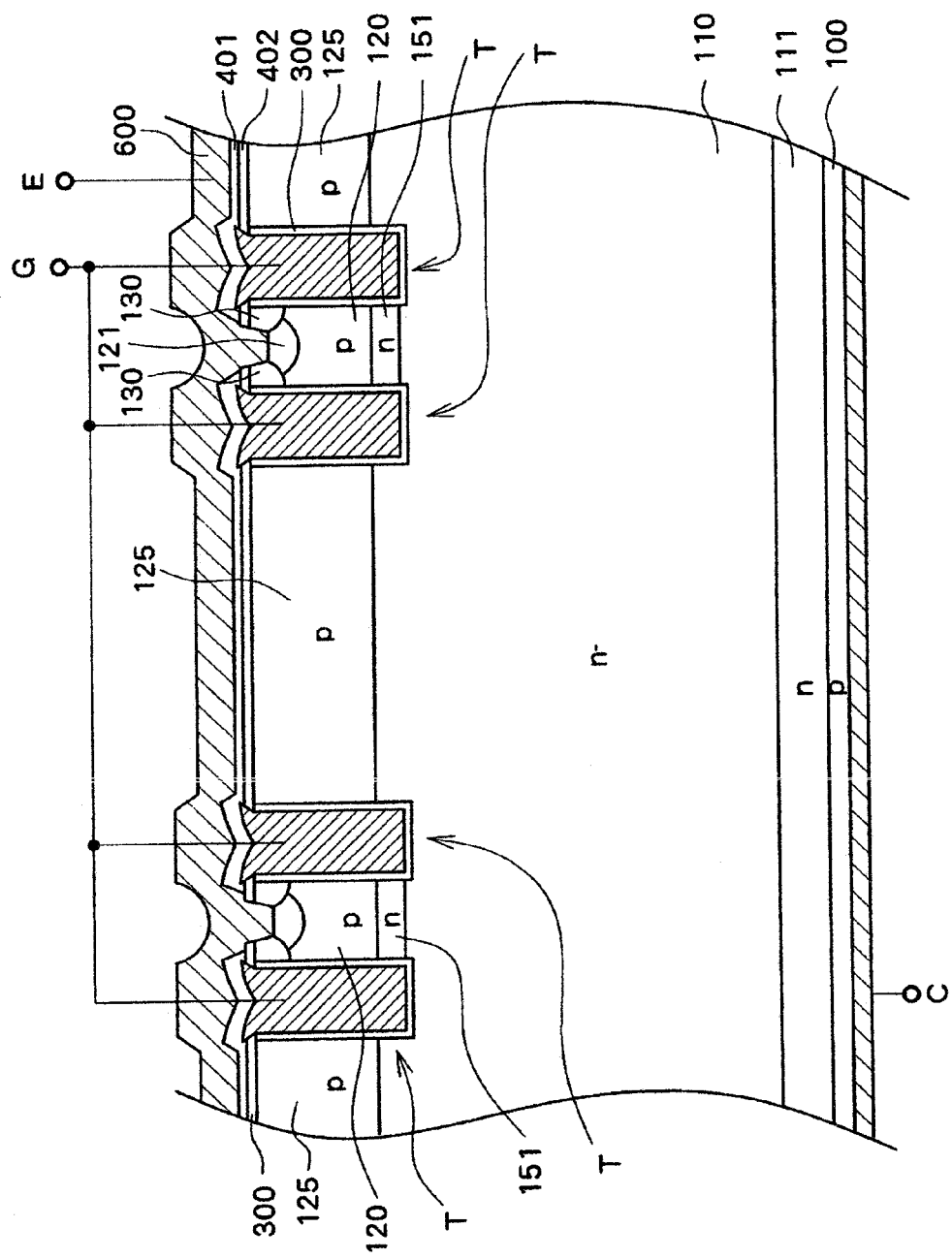
FIG. 12 is the explanatory diagram for illustrating the example of the trench-gate structure semiconductor device.
Figure 13:
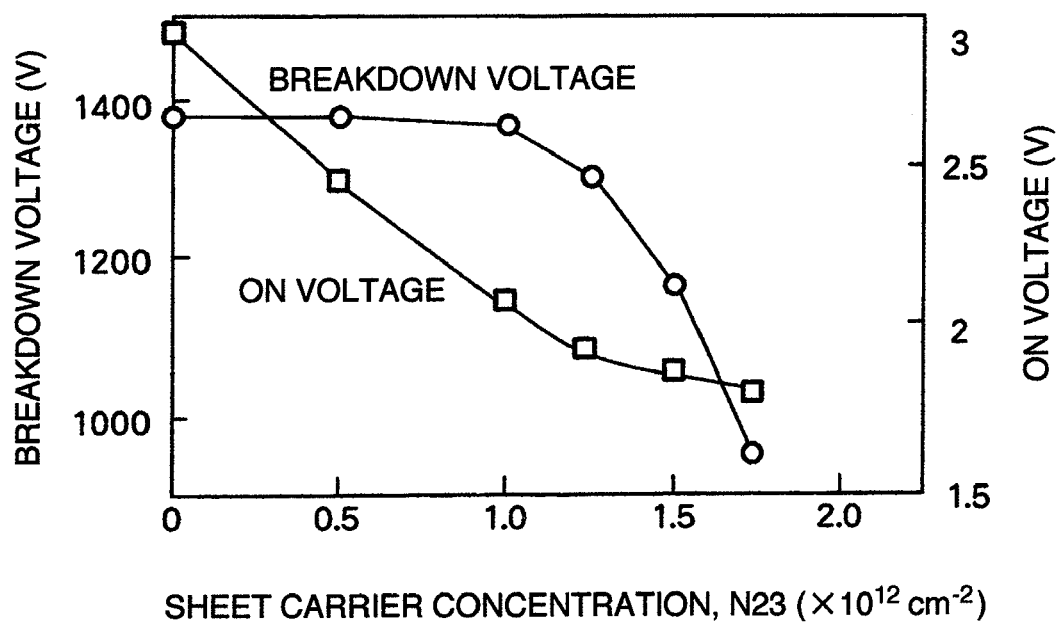
FIG. 13 is the explanatory diagram for illustrating experimental result of the relationship among the sheet carrier concentration of the n layer in contact with the n⁻ layer, the breakdown voltage, and the ON voltage.

FIG. 10 illustrates an example of a power converter where the semiconductor device of the present embodiment is used. Incidentally, here, the semiconductor device of the present embodiment is denoted by a notation "IGBT". Actually, the IGBT is provided with a four-layer structure such as pnpn. The semiconductor device of the present embodiment, however, differs therefrom in a point that the semiconductor device is provided with a six-layer structure such as pnpnpn. Since a notation corresponding thereto is not defined in the present circumstances, the notation "IGBT" is substituted for the corresponding notation. This power converter is a common inverter, and thus its operation is widely known. Accordingly, the detailed explanation thereof will be omitted here. The embodiments where the semiconductor device is used for the inverter have been described here. Nevertheless, not only in the inverter but also in circuits such as converter where transistors are used, the semiconductor device of the present embodiment is available by replacing the transistors by the IGBTs. Here reference numerals 801 to 806 denote gate circuits.

It should be further understood by those skilled in the art that although the foregoing description has been made on embodiments of the invention, the invention is not limited thereto and various changes and modifications may be made without departing from the spirit of the invention and the scope of the appended claims.

The invention claimed is:

1. A semiconductor device in which a collector electrode is provided such that said collector electrode is in contact with one surface side of a semiconductor substrate,
    said semiconductor device, comprising:
    a first layer portion in which a first semiconductor region of a first conductivity type, a second semiconductor region of a second conductivity type, and a third semiconductor region of said second conductivity type having a carrier concentration lower than a carrier concentration of said second semiconductor region are multilayered from said one surface side;
    a second layer portion including:
    a fourth semiconductor region of said first conductivity type multilayered in a partial region of said third semiconductor region, and having a carrier concentration higher than the carrier concentration of said third semiconductor region, a fifth semiconductor region of said second conductivity type multilayered on said fourth semiconductor region, a sixth semiconductor region of said first conductivity type multilayered on said fifth semiconductor region, and a seventh semiconductor region of said second conductivity type multilayered in a partial region of said sixth semiconductor region, and having a carrier concentration higher than carrier concentration of said sixth semiconductor region;

a gate electrode located along said second layer portion via a gate insulating film, said gate insulating film being provided such that said gate insulating film is in contact with said semiconductor regions included in said second layer portion; and an emitter electrode which is in low-resistance contact with said seventh semiconductor region of said second layer portion, wherein said gate insulating film is formed along said respective semiconductor regions included in said second layer portion, and on a side surface of a trench, said trench extending toward said first layer portion and reaching said third semiconductor region; and where a plane density of carrier concentration on a plane whose distance from a surface on said emitter-electrode side is substantially constant and is substantially equal to or higher than $1\times10^{12}/cm^2$ within said fourth semiconductor region.

2. The semiconductor device according to claim 1, wherein said trench, on its one side surface, is in contact with said respective semiconductor regions included in said second layer portion, and an eighth semiconductor region of said first conductivity type is in contact with the other side surface of said trench, said eighth semiconductor region being multilayered on said third semiconductor region such that a partial region of said eighth semiconductor region is in contact with said trench, and having a carrier concentration higher than the carrier concentration of said third semiconductor region.

3. The semiconductor device according to claim 2, wherein a plurality of said trenches are provided.

4. The semiconductor device according to claim 3, wherein spacing between said trenches which are adjacent to each other via said eighth semiconductor region is wider than spacing between said trenches which are adjacent to each other with said second layer portion sandwiched therebetween.

5. The semiconductor device according to claim 1, wherein a density of carrier concentration on a plane whose distance from a surface on said emitter-electrode side is constant is equal to or lower than $1\times10^{17}/cm^3$ within said fifth semiconductor region.

6. The semiconductor device according to claim 2, wherein a density of carrier concentration on a plane whose distance from a surface on said emitter-electrode side is constant is equal to or larger than $1\times10^{12}/cm^2$ and a carrier concentration is equal to or lower than $1\times10^{17}/cm^2$ within said fifth semiconductor region.

\* \* \* \* \*